US012717233B2

(12) United States Patent
Kato et al.

(10) Patent No.: US 12,717,233 B2
(45) Date of Patent: Aug. 25, 2026

(54) PHOTOSENSITIVE RESIN COMPOSITION, PHOTOSENSITIVE ELEMENT, METHOD FOR FORMING RESIST PATTERN, AND METHOD FOR PRODUCING PRINTED WIRING BOARD

(71) Applicant: Resonac Corporation, Tokyo (JP)

(72) Inventors: Tetsuya Kato, Tokyo (JP); Akiko Takeda, Tokyo (JP); Yutaka Kawakami, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 692 days.

(21) Appl. No.: 18/019,181

(22) PCT Filed: Apr. 27, 2021

(86) PCT No.: PCT/JP2021/016820

§ 371 (c)(1),
(2) Date: Feb. 1, 2023

(87) PCT Pub. No.: WO2022/030053

PCT Pub. Date: Feb. 10, 2022

(65) Prior Publication Data

US 2023/0273518 A1 Aug. 31, 2023

(30) Foreign Application Priority Data

Aug. 7, 2020 (JP) ................................ 2020-134944

(51) Int. Cl.
*G03F 7/029* (2006.01)
*G03F 7/033* (2006.01)
*G03F 7/20* (2006.01)

(52) U.S. Cl.
CPC ............ *G03F 7/0295* (2013.01); *G03F 7/033* (2013.01); *G03F 7/2006* (2013.01)

(58) Field of Classification Search
None
See application file for complete search history.

(56) References Cited

U.S. PATENT DOCUMENTS

2008/0268374 A1* 10/2008 Tashiro .................. G03F 7/028 430/323
2016/0330845 A1* 11/2016 Okade .................. G03F 7/2053
2018/0237549 A1* 8/2018 Takeuchi .............. B32B 27/281
2020/0174368 A1* 6/2020 Kim ...................... G03F 7/0233

FOREIGN PATENT DOCUMENTS

| | | | |
|---|---|---|---|
| CN | 102636956 | A | 8/2012 |
| CN | 103091985 | A | 5/2013 |
| CN | 103988154 | A | 8/2014 |
| CN | 110121679 | A | 8/2019 |
| CN | 111051983 | A | 4/2020 |
| CN | 113412289 | A | 9/2021 |
| JP | 2001-290265 | A | 10/2001 |
| JP | 2008-275822 | A | 11/2008 |
| JP | 2013-195712 | A | 9/2013 |
| JP | 2016-143064 | A | 8/2016 |
| JP | 2018204011 | A | * 12/2018 |
| TW | 201627758 | A | 8/2016 |
| TW | 202040272 | A | 11/2020 |
| WO | 2016/104585 | A1 | 6/2016 |
| WO | 2020/162464 | A1 | 8/2020 |

OTHER PUBLICATIONS

Translated Description of Anabuki (Year: 2018).*

* cited by examiner

*Primary Examiner* — Jonathan Johnson
*Assistant Examiner* — Andrew Preston Traywick
(74) *Attorney, Agent, or Firm* — FITCH, EVEN, TABIN & FLANNERY, LLP

(57) ABSTRACT

An aspect of the present disclosure relates to a photosensitive resin composition containing a binder polymer, a photopolymerizable compound, and a photopolymerization initiator, in which the binder polymer includes a structural unit derived from a (meth)acrylate compound having a dicyclopentanyl group, and a weight molecular weight of the binder polymer is 7500 to 23000.

14 Claims, No Drawings

PHOTOSENSITIVE RESIN COMPOSITION, PHOTOSENSITIVE ELEMENT, METHOD FOR FORMING RESIST PATTERN, AND METHOD FOR PRODUCING PRINTED WIRING BOARD

CROSS-REFERENCE TO RELATED APPLICATIONS

This application is a U.S. national phase application filed under 35 U.S.C. § 371 of International Application No. PCT/JP2021/016820, filed Apr. 27, 2021, designating the United States, which claims priority from Japanese application No. 2020-134944, filed Aug. 7, 2020, which are incorporated herein by reference in their entireties.

TECHNICAL FIELD

The present invention relates to a photosensitive resin composition, a photosensitive element, a method for forming a resist pattern, and a method for producing a printed wiring board.

BACKGROUND ART

In the field of printed wiring board production, photosensitive elements (laminates) including a photosensitive resin composition, a support, and a layer formed using a photosensitive resin composition (hereinafter, referred to as "photosensitive layer") on the support have been widely used as resist materials used for an etching treatment, a plating treatment, or the like.

In the case of producing a printed wiring board using a photosensitive element, first, a photosensitive layer of a photosensitive element is laminated on a substrate for circuit formation. Next, a predetermined part of the photosensitive layer is irradiated with an active light ray to cure an exposed area. Thereafter, the support is peeled off to be removed, and an unexposed area of the photosensitive layer is removed with a developing solution, thereby forming a resist pattern on the substrate. Next, the substrate having the resist pattern formed is subjected to an etching treatment or a plating treatment using the resist pattern as a mask to form a circuit pattern on the substrate, and a cured area (resist pattern) of the photosensitive layer is finally peeled off from the substrate to be removed.

As an exposure method, the photosensitive layer is subjected to pattern exposure through a mask film or the like. In recent years, a projection exposure method in which the photosensitive layer is exposed to light by irradiation via a lens with an active light ray projecting a photomask image has been used. As a light source to be used in the projection exposure method, an ultrahigh pressure mercury lamp is used. Generally, an exposure apparatus using the i-line monochromatic light (365 nm) as an exposure wavelength is mostly used, but the exposure wavelengths of the h-line monochromatic light (405 nm) and the ihg mixed lines may be used in some cases.

The projection exposure method is an exposure method that can ensure high resolving power and high alignment as compared to a contact exposure method. Therefore, much attention has been given to the projection exposure method in recent years in which circuit formation in printed wiring boards is required to be refined.

With densification of printed wiring boards in recent years, a demand has been increasing for a photosensitive resin composition excellent in resolving power (resolution) and adhesiveness. Particularly, in the production of package substrates, there is a demand for a photosensitive resin composition that can form a resist pattern with a line width/a space width of 10/10 (unit: μm) or less. For example, in Patent Literature 1, it is investigated that the resolution and the adhesiveness are improved by using a specific photopolymerizable compound.

CITATION LIST

Patent Literature

Patent Literature 1: JP 2013-195712 A

SUMMARY OF INVENTION

Technical Problem

In recent years, miniaturization of conductor patterns has been increasingly developed, and thus it is desired for a photosensitive resin composition to further improve the resolution and the adhesiveness and to form a fine resist pattern.

The present disclosure has been devised in view of the problems of the conventional arts described above, and an object thereof is to provide a photosensitive resin composition capable of forming a resist pattern excellent in resolution and adhesiveness, a photosensitive element using the same, a method for forming a resist pattern, and a method for producing a printed wiring board.

Solution to Problem

An aspect of the present disclosure relates to a photosensitive resin composition containing a binder polymer, a photopolymerizable compound, and a photopolymerization initiator, in which the binder polymer includes a structural unit derived from a (meth)acrylate compound having a dicyclopentanyl group, and a weight molecular weight of the binder polymer is 7500 to 23000.

A content of the structural unit derived from a (meth) acrylate compound having a dicyclopentanyl group may be 1 to 30% by mass on the basis of the total mass of structural units derived from polymerizable monomers constituting the binder polymer.

The above-described photosensitive resin composition may further contain a sensitizer having an absorption at 340 to 430 nm.

Another aspect of the present disclosure relates to a photosensitive element including: a support; and a photosensitive layer formed using the above-described photosensitive resin composition on the support.

Still another aspect of the present disclosure relates to a method for forming a resist pattern, the method including a photosensitive layer formation step of laminating a photosensitive layer containing the above-described photosensitive resin composition or a photosensitive layer of the above-described photosensitive element on a substrate; an exposure step of irradiating a predetermined part of the photosensitive layer with an active light ray to form a photo-cured area; and a development step of removing an area other than the predetermined part of the photosensitive layer from the substrate.

Still another aspect of the present disclosure relates to a method for producing a printed wiring board, the method including a step of subjecting a substrate having a resist pattern formed by the above-described method for forming a resist pattern to an etching treatment or a plating treatment to form a conductor pattern.

Advantageous Effects of Invention

According to the present disclosure, it is possible to provide a photosensitive resin composition capable of forming a resist pattern excellent in resolution and adhesiveness, a photosensitive element using the same, a method for forming a resist pattern, and a method for producing a printed wiring board.

DESCRIPTION OF EMBODIMENTS

Hereinafter, embodiments for carrying out the present disclosure will be specifically described. However, the present disclosure is not limited to the following embodiments. In the present specification, the term "step" includes not only an independent step but also a step by which an intended action of the step is achieved, even though the step cannot be clearly distinguished from other steps. In the present specification, the term "layer" is meant to include a structure having a shape that is formed over the entire surface when observed in a plan view, as well as a structure having a shape that is formed in a portion. In the present specification, the term "(meth)acrylic acid" means at least one of "acrylic acid" and "methacrylic acid" corresponding thereto. The same applies to other analogous expressions such as (meth) acrylate.

In the present specification, a numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of a numerical range of a certain stage may be substituted by the upper limit value or the lower limit value of a numerical range of another stage. Furthermore, in a numerical range described in the present specification, the upper limit value or the lower limit value of the numerical range may be substituted by a value disclosed in the Examples.

In the present specification, when reference is made to the amount of each component in a composition, in a case where a plurality of substances corresponding to each component exist in the composition, the amount of each component in the composition means the total amount of the plurality of substances that exist in the composition, unless otherwise specified.

[Photosensitive Resin Composition]

A photosensitive resin composition of the present embodiment contains a component (A): a binder polymer, a component (B): a photopolymerizable compound, and a component (C): a photopolymerization initiator. The binder polymer includes a structural unit derived from a (meth) acrylate compound having a dicyclopentanyl group, and a weight average molecular weight of the binder polymer is 7500 to 23000. The above-described photosensitive resin composition may further contain a component (D): a sensitizer having an absorption at 340 nm to 430 nm, or other components, as necessary. Hereinafter, respective components used in the photosensitive resin composition of the present embodiment will be more specifically described.

(Component (A): Binder Polymer)

According to the photosensitive resin composition of the present embodiment, by containing the components (A) to (C) described above, the photosensitive resin composition is excellent in resolution and adhesiveness and can form a fine resist pattern. In particular, the present inventors have speculated that the adhesiveness can be further enhanced by using a binder polymer having a specific structure and a specific weight average molecular weight (Mw).

The component (A) can be produced, for example, by radical polymerization of a polymerizable monomer that includes a (meth)acrylate compound having a dicyclopentanyl group. From the viewpoint of improving the hydrophobicity of the binder polymer, as the (meth)acrylate compound having a dicyclopentanyl group, for example, a compound represented by Formula (1) below may be used.

[Chemical Formula 1]

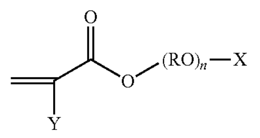

(1)

In Formula (1), Y represents a hydrogen atom or a methyl group, R represents an alkylene group having 1 to 4 carbon atoms, X represents a dicyclopentanyl group, and n represents an integer of 0 to 2.

Examples of the (meth)acrylate compound having a dicyclopentanyl group include dicyclopentanyl (meth)acrylate, dicyclopentanyloxyethyl (meth)acrylate, dicyclopentanyloxypropyl (meth)acrylate, and dicyclopentanyloxypropyloxyethyl (meth)acrylate. From the viewpoint of further enhancing the hydrophobicity of the binder polymer, dicyclopentanyl (meth)acrylate may be used.

From the viewpoint of further improving the resolution and adhesiveness of the photosensitive resin composition, the content of the structural unit derived from a (meth) acrylate compound having a dicyclopentanyl group (hereinafter, also referred to as "dicyclopentanyl-based structural unit") may be 1 to 30% by mass, and is preferably 2 to 20% by mass, more preferably 3 to 15% by mass, and further preferably 4 to 10% by mass, on the basis of the total mass (100% by mass) of structural units derived from polymerizable monomers constituting the binder polymer.

The component (A) may further include a structural unit derived from (meth)acrylic acid from the viewpoint of improving the alkali developability, and may further include a structural unit derived from styrene or a styrene derivative (hereinafter, also referred to as "styrene-based structural unit") from the viewpoint of improving the resolution and the adhesiveness and reducing the amount of occurrence of resist footing.

From the viewpoint of improving the hydrophobicity of the binder polymer, as the styrene or the styrene derivative, a compound represented by Formula (2) below may be used.

[Chemical Formula 2]

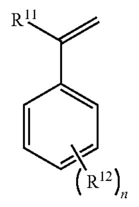

(2)

In Formula (2), $R^{11}$ represents a hydrogen atom or a methyl group, $R^{12}$s each independently represent a hydrogen atom, an alkyl group, a (meth)acryloyl group, a phenyl group, or derivatives thereof, and n represents an integer of 1 to 5.

Examples of the styrene derivative include vinyl toluene, α-methylstyrene, p-methylstyrene, and p-ethylstyrene.

From the viewpoint of improving the resolution and the adhesiveness and reducing the amount of occurrence of resist footing, the content of the dicyclopentanyl-based structural unit and the styrene-based structural unit may be 50% by mass or more, 55% by mass or more, or 58% by mass or more, on the basis of the total mass of structural units derived from polymerizable monomers constituting the binder polymer. From the viewpoint that the developing time is moderately shortened and development residues are difficult to occur, the content of the dicyclopentanyl-based structural unit and the styrene-based structural unit may be 85% by mass or less, 80% by mass or less, or 75% by mass or less.

From the viewpoint of making the resolution, the adhesiveness, and the repressibility of occurrence of resist footing favorable, the content of the structural unit derived from (meth)acrylic acid may be 10 to 40% by mass, 15 to 35% by mass, or 20 to 30% by mass, on the basis of the total mass of structural units derived from polymerizable monomers constituting the binder polymer.

The component (A) may further include structural units derived from polymerizable monomers (hereinafter, also referred to as "other monomers") other than the above. Examples of the other monomers include benzyl (meth) acrylate or a derivative thereof, cycloalkyl (meth)acrylate, furfuryl (meth)acrylate, tetrahydrofurfuryl (meth)acrylate, isobornyl (meth)acrylate, adamantyl (meth)acrylate, dimethylaminoethyl (meth)acrylate, diethylaminoethyl (meth) acrylate, glycidyl (meth)acrylate, 2,2,2-trifluoroethyl (meth) acrylate, 2,2,3,3-tetrafluoropropyl (meth)acrylate, β-furyl (meth)acrylic acid, β-styryl (meth)acrylic acid, maleic acid, maleic anhydride, maleic acid monoalkyl ester, fumaric acid, cinnamic acid, α-cyanocinnamic acid, itaconic acid, crotonic acid, and propiolic acid. These can be used singly or in combination of two or more kinds thereof.

The weight average molecular weight (Mw) of the component (A) is 7500 to 23000, and may be 9000 to 22000, 10000 to 21500, or 11000 to 21000. When the Mw is 23000 or less, there is a tendency that the resolution and the developability are improved, and when the Mw is 7500 or more, there is a tendency that the flexibility of a cured film is improved, so that chipping and peeling of the resist pattern are difficult to occur. The degree of dispersion (Mw/Mn) of the component (A) may be 1.0 to 3.0 or 1.0 to 2.3. When the degree of dispersion is decreased, there is a tendency that the resolution is improved. The weight average molecular weight of the binder polymer is measured by gel permeation chromatography (GPC) (calculated based on a calibration curve using standard polystyrene).

The acid value of the component (A) may be 100 to 250 mgKOH/g, 120 to 240 mgKOH/g, 140 to 230 mgKOH/g, or 150 to 230 mgKOH/g. When the acid value of the component (A) is 100 mgKOH/g or more, an increase in developing time can be sufficiently suppressed, and when the acid value of the component (A) is 250 mgKOH/g or less, the developing solution resistance (adhesiveness) of a cured product of the photosensitive resin composition is likely to be improved.

The acid value of the component (A) can be measured as follows. First, 1 g of the binder polymer for measurement of the acid value is precisely weighed out. 30 g of acetone is added to the precisely weighed binder polymer, and this resultant was homogeneously dissolved. Next, an appropriate amount of phenolphthalein as an indicator is added to this solution and then titration is performed using a 0.1 N potassium hydroxide (KOH) aqueous solution. The amount of KOH in milligram needed for neutralization of the acetone solution of the binder polymer for measurement is calculated to determine the acid value. In a case where a solution obtained by mixing the binder polymer with a synthetic solvent, a diluent solvent, or the like is used for measurement, the acid value is calculated by the following formula.

$$\text{Acid value}=0.1\times Vf\times 56.1/(Wp\times I/100)$$

In the formula, Vf represents the titer (mL) of the KOH aqueous solution, Wp represents the measured mass (g) of the solution containing the binder polymer, and I represents the measured proportion (% by mass) of nonvolatile components in the solution containing the binder polymer.

Note that, in a case where the binder polymer is blended in a state of being mixed with volatile components such as a synthetic solvent or a diluent solvent, the acid value can be measured after first heating for 1 to 4 hours at a temperature higher than the boiling point of the volatile components by 10° C. or higher in advance, before precise weighing, to remove the volatile components.

In the photosensitive resin composition of the present embodiment, the component (A) may be used as a single binder polymer alone or may be used as an arbitrary combination of two or more kinds of binder polymers. Examples of the binder polymer in the case of being used in combination of two or more kinds thereof include two or more kinds of binder polymers each including a different copolymerizing component (including those having different monomer units as copolymerizing components), two or more kinds of binder polymers each having a different Mw, and two or more kinds of binder polymers each having a different degree of dispersion.

The content of the component (A) in the photosensitive resin composition of the present embodiment may be 20 to 90% by mass, 30 to 80% by mass, or 40 to 65% by mass, on the basis of the total solid content of the photosensitive resin composition. When the content of the component (A) is 20% by mass or more, there is a tendency that the film moldability is excellent, and when the content of the component (A) is 90% by mass or less, there is a tendency that the sensitivity and the resolution are excellent.

(Component (B): Photopolymerizable Compound)

The component (B) is not particularly limited as long as it has at least one ethylenically unsaturated bond and is a photopolymerizable compound. From the viewpoint of improving the alkali developability, the resolution, and the peeling property after curing, the component (B) preferably includes at least one of bisphenol type (meth)acrylates, and more preferably includes a bisphenol A-type (meth)acrylate among the bisphenol type (meth)acrylates. Examples of the bisphenol A-type (meth)acrylate include 2,2-bis(4-((meth) acryloxypolyethoxy)phenyl)propane, 2,2-bis(4-((meth) acryloxypolypropoxy)phenyl)propane, 2,2-bis(4-((meth) acryloxypolybutoxy)phenyl)propane, and 2,2-bis(4-((meth) acryloxypolyethoxypolypropoxy)phenyl)propane. Of these, from the viewpoint of further improving the resolution and the peeling property, 2,2-bis(4-((meth)acryloxypolyethoxy) phenyl)propane is preferred.

Examples of commercially available products of the bisphenol A-type (meth)acrylate include BPE-200 (manufactured by SHIN-NAKAMURA CHEMICAL Co., Ltd., trade name) as 2,2-bis(4-((meth)acryloxydipropoxy)phenyl)propane and BPE-500 (manufactured by SHIN-NAKAMURA CHEMICAL Co., Ltd., trade name) and FA-321M (manufactured by Showa Denko Materials Co., Ltd. (former name: Hitachi Chemical Co., Ltd.), trade name) as 2,2-bis(4-(methacryloxypentaethoxy)phenyl)propane. Note that, the refractive index of BPE-200 is 1.512, and the refractive index of BPE-500 is 1.532. These bisphenol A-type (meth) acrylates may be used singly or in combination of two or more kinds thereof.

The content of the bisphenol type (meth)acrylate may be 40 to 98% by mass, 50 to 97% by mass, 60 to 95% by mass, or 70 to 90% by mass, with respect to the total amount of the component (B). When this content is 40% by mass or more, the resolution, the adhesiveness, and the repressibility of occurrence of resist footing become more favorable, and when this content is 98% by mass or less, the developing time is moderately shortened and development residues are more difficult to occur.

From the viewpoint of improving the flexibility of a cured product (cured film), the component (B) other than the bisphenol type (meth)acrylate may further include at least one of polyalkylene glycol di(meth)acrylates having at least one of a (poly)oxyethylene chain and a (poly)oxypropylene chain in the molecule, and may further include a polyalkylene glycol di(meth)acrylate having both of a (poly) oxyethylene chain and a (poly)oxypropylene chain in the molecule. Examples of the polyalkylene glycol di(meth) acrylate include FA-023M (manufactured by Showa Denko Materials Co., Ltd., trade name), FA-024M (manufactured by Showa Denko Materials Co., Ltd., trade name), and NK ESTETR HEMA-9P (manufactured by SHIN-NAKAMURA CHEMICAL Co., Ltd., trade name). These may be used singly or in combination of two or more kinds thereof.

The content of the polyalkylene glycol di(meth)acrylate may be 2 to 40% by mass, 3 to 30% by mass, or 5 to 20% by mass, on the basis of the total amount of the component (B).

As the component (B) other than the above, a nonylphenoxypolyethylene oxyacrylate, a phthalic acid-based compound, a polyol (meth)acrylate ester, an alkyl (meth)acrylate ester, and the like may be used. Of these, from the viewpoint of improving the resolution, the adhesiveness, and the peeling property after resist formation and curing in a well-balanced manner, the component (B) may include at least one selected from a nonylphenoxypolyethylene oxyacrylate and a phthalic acid-based compound. However, since the refractive indices of these compounds are relatively low, from the viewpoint of improving the resolution, the content thereof may be 5 to 50% by mass, 5 to 40% by mass, or 10 to 30% by mass, on the basis of the total amount of the component (B).

Examples of the nonylphenoxypolyethylene oxyacrylate include nonylphenoxytriethylene oxyacrylate, nonylphenoxytetraethylene oxyacrylate, nonylphenoxypentaethylene oxyacrylate, nonylphenoxyhexaethylene oxyacrylate, nonylphenoxyheptaethylene oxyacrylate, nonylphenoxyoctaethylene oxyacrylate, nonylphenoxynonaethylene oxyacrylate, nonylphenoxydecaethylene oxyacrylate, and nonylphenoxyundecaethylene oxyacrylate.

Examples of the phthalic acid-based compound include γ-chloro-β-hydroxypropyl-β'-(meth)acryloyloxyethyl-o-phthalate, β-hydroxyethyl-β'-(meth)acryloyloxyethyl-o-phthalate, and β-hydroxypropyl-β'-(meth)acryloyloxyethyl-o-phthalate, and among these, the phthalic acid-based compound may be γ-chloro-β-hydroxypropyl-β'-(meth)acryloyloxyethyl-o-phthalate. The γ-chloro-β-hydroxypropyl-β'-methacryloyloxyethyl-o-phthalate is commercially available as FA-MECH (manufactured by Showa Denko Materials Co., Ltd., trade name).

From the viewpoint of improving the sensitivity and reducing footing trailing, the component (B) may include a polyol (meth)acrylate ester. Examples of the polyol (meth) acrylate ester include trimethylolpropane polyethoxy tri(meth)acrylate, trimethylolpropane polypropoxy tri(meth) acrylate, trimethylolpropane polybutoxy tri(meth)acrylate, trimethylolpropane polyethoxy polypropoxy tri(meth)acrylate, trimethylolethane polyethoxy tri(meth)acrylate, trimethylolethane polypropoxy tri(meth)acrylate, trimethylolethane polybutoxy tri(meth)acrylate, trimethylolethane polyethoxy polypropoxy tri(meth)acrylate, pentaerythritol polyethoxy tri(meth)acrylate, pentaerythritol polypropoxy tri(meth)acrylate, pentaerythritol polybutoxy tri(meth)acrylate, pentaerythritol polyethoxy polypropoxy tri(meth)acrylate, glyceryl polyethoxy tri(meth)acrylate, glyceryl polypropoxy tri(meth)acrylate, glyceryl polybutoxy tri(meth) acrylate, and glyceryl polyethoxy polypropoxy tri(meth) acrylate.

The content of the component (B) is set to preferably 20 to 60 parts by mass, more preferably 30 to 55 parts by mass, and further preferably 35 to 50 parts by mass, with respect to 100 parts by mass of the total amount of the component (A) and the component (B). When the content of the component (B) is in this range, the photosensitivity and the film coatability become more favorable in addition to the resolution, the adhesiveness, and the resist footing occurrence of the photosensitive resin composition.

(Component (C): Photopolymerization Initiator)

The component (C) is not particularly limited, and from the viewpoint of improving the sensitivity and the resolution in a well-balanced manner, a hexaarylbiimidazole derivative or an acridine compound having one or more acridinyl groups may be used. Particularly, in a case where the photosensitive layer is exposed using an active light ray at 390 nm to 420 nm, from the viewpoint of the sensitivity and the adhesiveness, the component (C) may include an acridine compound having one or more acridinyl groups.

Examples of the hexaarylbiimidazole derivative include 2-(o-chlorophenyl)-4,5-diphenylbiimidazole, 2,2',5-tris-(o-chlorophenyl)-4-(3,4-dimethoxyphenyl)-4',5'-diphenylbiimidazole, 2,4-bis-(o-chlorophenyl)-5-(3,4-dimethoxyphenyl)-diphenylbiimidazole, 2,4,5-tris-(o-chlorophenyl)-diphenylbiimidazole, 2-(o-chlorophenyl)-bis-4,5-(3,4-dimethoxyphenyl)-biimidazole, 2,2'-bis-(2-fluorophenyl)-4,4',5,5'-tetrakis-(3-methoxyphenyl)-biimidazole, 2,2'-bis-(2,3-difluoromethylphenyl)-4,4',5,5'-tetrakis-(3-methoxyphenyl)-biimidazole, 2,2'-bis-(2,4-difluorophenyl)-4,4',5,5'-tetrakis-(3-methoxyphenyl)-biimidazole, and 2,2'-bis-(2,5-difluorophenyl)-4,4',5,5'-tetrakis-(3-methoxyphenyl)-biimidazole. Of these, from the viewpoint of the sensitivity and the resolution, a 2-(o-chlorophenyl)-4,5-diphenylimidazole dimer is preferred. As the 2-(o-chlorophenyl)-4,5-diphenylimidazole dimer, 2,2'-bis(2-chlorophenyl)-4,4',5,5'-tetraphenyl-1,2-biimidazole is commercially available as trade name "B-CIM" manufactured by Hodogaya Chemical Co., Ltd.

Examples of the acridine compound include acridine compounds having one acridinyl group such as 9-phenylacridine, 9-(p-methylphenyl)acridine, 9-(m-methylphenyl) acridine, 9-(p-chlorophenyl)acridine, 9-(m-chlorophenyl) acridine, 9-aminoacridine, 9-dimethylaminoacridine, 9-diethylaminoacridine, and 9-pentylaminoacridine; and acridine compounds having two acridinyl groups such as bis(9-acridinyl)alkanes such as 1,2-bis(9-acridinyl)ethane, 1,4-bis(9-acridinyl)butane, 1,6-bis(9-acridinyl)hexane, 1,8-bis(9-acridinyl)octane, 1,10-bis(9-acridinyl)decane, 1,12-bis(9-acridinyl)dodecane, 1,14-bis(9-acridinyl)tetradecane, 1,16-bis(9-acridinyl)hexadecane, 1,18-bis(9-acridinyl)octadecane, and 1,20-bis(9-acridinyl)eicosane, 1,3-bis(9-acridinyl)-2-oxapropane, 1,3-bis(9-acridinyl)-2-thiapropane, and 1,5-bis(9-acridinyl)-3-thiapentane. These are used singly or in combination of two or more kinds thereof.

Examples of the other photopolymerization initiators include benzophenones such as 4,4'-bis(diethylamino)benzophenone; aromatic ketones such as 2-benzyl-2-dimethylamino-1-(4-morpholinophenyl)-butanone-1,2-methyl-1-[4-(methylthio)phenyl]-2-morpholino-propanone-1; quinones such as alkylanthraquinone; benzoinether compounds such as benzoinalkyl ethers; benzoin compounds such as benzoin and alkylbenzoin; benzyl derivatives such as benzyldimethylketal, N-phenylglycine, and N-phenylglycine derivatives; acylphosphine oxide-based photopolymerization initiators such as 2,4,6-trimethylbenzoyl-diphenyl-phosphine oxide and bis(2,4,6-trimethylbenzoyl)-phenylphosphine oxide; oxime ester compounds such as 1,2-octanedione,1-[4-(phenylthio)phenyl-,2-(0-benzoyloxime)] and ethanone,1-[9-ethyl-6-(2-methylbenzoyl)-9H-carbazol-3-yl]-,1-(0-acetyloxime). These may be mixed with a hexaarylbiimidazole derivative or an acridine compound and then used.

The content of the component (C) may be 0.1 to 10% by mass, 1 to 5% by mass, or 2 to 4.5% by mass, on the basis of the total solid content of the photosensitive resin composition. When the content of the component (C) is within the above range, there is a tendency that both the photosensitivity and the resolution are easily improved in a well-balanced manner. From the viewpoint of balance between the photosensitivity and the resolution, the content of the component (C) may be 0.5 to 10 parts by mass, 1 to 8 parts by mass, or 1.5 to 5 parts by mass, with respect to 100 parts by mass of the total amount of the component (A) and the component (B).

(Component (D): Sensitizer)

The photosensitive resin composition of the present embodiment may further contain a sensitizer having an absorption at 340 to 430 nm as a component (D). Thereby, the photosensitivity of the photosensitive resin composition becomes further favorable. Examples of the sensitizer include a dialkylaminobenzophenone compound, a pyrazoline compound, an anthracene compound, a coumarin compound, a xanthone compound, an oxazole compound, a benzoxazole compound, a thiazole compound, a benzothiazole compound, a triazole compound, a stilbene compound, a triazine compound, a thiophene compound, a naphthalimide compound, and a triarylamine compound. From the viewpoint of the sensitivity and the adhesiveness, the sensitizer may include at least one selected from the group consisting of a pyrazoline compound, an anthracene compound, a coumarin compound, and a triarylamine compound, and may include at least one selected from the group consisting of a pyrazoline compound, an anthracene compound, and a coumarin compound.

Examples of the pyrazoline compound include 1-phenyl-3-(4-methoxystyryl)-5-(4-methoxyphenyl)pyrazoline, 1-phenyl-3-(4-tert-butyl styryl)-5-(4-tert-butylphenyl)pyrazoline, and 1-phenyl-3-biphenyl-5-(4-tert-butylphenyl)pyrazoline. Examples of the anthracene compound include 9,10-dibutoxyanthracene and 9,10-diphenylanthracene. Examples of the coumarin compound include 3-benzoyl-7-diethylaminocoumarin, 7-diethylamino-4-m ethylcoumarin, 3,3'-carbonylbis(7-diethylaminocoumarin), and 2,3,6,7-tetrahydro-9-methyl-1H,5H,11H-[1]benzopyrano[6,7,8-ij]quinolizin-11-one.

In a case where the photosensitive resin composition contains the component (D), the content of the component (D) may be 0.01 to 10% by mass, 0.05 to 5% by mass, or 0.1 to 3% by mass, on the basis of the total solid content of the photosensitive resin composition. When the content of the component (D) is 0.01% by mass or more, the sensitivity and the resolution are further improved, and when the content of the component (D) is 10% by mass or less, the resist shape is suppressed from being an inverted trapezoid, and the adhesiveness is further improved. From the viewpoint of balance between the resolution and the adhesiveness, the content of the component (D) may be 0.005 to 0.5 parts by mass, 0.008 to 0.2 parts by mass, or 0.01 to 0.1 parts by mass, with respect to 100 parts by mass of the total amount of the component (A) and the component (B).

(Other Components)

The photosensitive resin composition can further contain other components as necessary. Examples of the other components include a hydrogen donor, an ultraviolet absorber, a photopolymerizable compound (such as an oxetane compound) having at least one cation polymerizable cyclic ether group in the molecule thereof, a cation polymerization initiator, a dye (such as malachite green), tribromophenylsulfone, a photochromic agent, a thermal development inhibitor, a plasticizer (such as p-toluenesulfonamide), a polymerization inhibitor (such as tert-butylcatechol), a silane coupling agent, a pigment, a filler, an antifoaming agent, a flame retardant, a stabilizing agent, a tackifier (such as benzotriazole), a leveling agent, a release promoter, an antioxidant, perfume, an imaging agent, and a thermal crosslinking agent. These are used singly or in combination of two or more kinds thereof. The content of each of the other components may be about 0.01 to 20% by mass.

When the photosensitive resin composition further contains a hydrogen donor, the sensitivity becomes further favorable. Examples of the hydrogen donor include bis[4-(dimethylamino)phenyl]methane, bis[4-(diethylamino)phenyl]methane, N-phenylglycine, and leuco crystal violet. These are used singly or in combination of two or more kinds thereof.

In a case where the photosensitive resin composition contains the hydrogen donor, the content thereof may be 0.01 to 10% by mass, 0.05 to 5% by mass, or 0.1 to 2% by mass, on the basis of the total solid content of the photosensitive resin composition. When the content of the hydrogen donor is 0.01% by mass or more, the sensitivity can be further improved, and when the content of the hydrogen donor is 10% by mass or less, an excessive hydrogen donor is suppressed from being precipitated as a foreign matter after the film formation.

When the photosensitive resin composition of the present embodiment further contains an ultraviolet absorber, a fine resist pattern excellent in resolution can be formed. In a photosensitive layer formed from a photosensitive resin composition containing an ultraviolet absorber, by increasing the absorbance at an exposure wavelength to suppress halation on the substrate surface, a significant difference in solubility between the exposed area and the unexposed area is generated so that high resolution can be expressed, and the adhesiveness of the photo-cured area can be improved.

In the case of exposing the photosensitive layer using an active light ray at 340 to 430 nm, since the ultraviolet absorber effectively absorbs light at an exposure wavelength, the ultraviolet absorber may include at least one selected from the group consisting of a benzophenone compound, a benzotriazole compound, and a triazine compound, and may include a benzophenone compound. The benzophenone compound may be a benzophenone compound in which some of hydrogen atoms are substituted with a group having an oxygen atom, and may be a benzophenone compound having a hydroxy group.

Examples of the benzophenone compound include 4,4'-dimethoxybenzophenone, 4,4'-bis(trimethylacetoxy)benzophenone, 2,4,4'-trihydroxybenzophenone, 2,2',4,4'-tetrahydroxybenzophenone, 2,3,4,4'-tetrahydroxybenzophenone, 2,2',3,4,4'-pentahydroxybenzophenone, 2,4-dihydroxybenzophenone, 2-hydroxy-4-methoxybenzophenone, 2,2'-dihydroxy-4-methoxybenzophenone, 2-hydroxy-4-(octyloxy) benzophenone, and 2-hydroxy-4-methoxy-benzophenone-5-sulfonic acid. Examples of the benzotriazole compound include 2,2-methylenebis[6-(2H-benzotriazole-2-yl)-4-tert-octylphenol], 2-(2'-hydroxy-5'-methacryloyloxyethylphenyl)-2H-benzotriazole, 2-(2H-benzotriazole-2-yl)-4,6-di-tert-pentylphenol, and 2-(5-chloro-2H-benzotriazole-2-yl)-6-tert-butyl-4-m ethylphenol. Examples of the triazine compound include 2-[4,6-di(2,4-xylyl)-1,3,5-triazin-2-yl]-5-octyloxyphenol and 2,4,6-tris(2-hydroxy-4-hexyloxy-3-methylphenyl)-1,3,5-triazine.

From the viewpoint of balance between the resolution and the adhesiveness, the content of the ultraviolet absorber may be 0.05 to 5.0 parts by mass, 0.1 to 4.0 parts by mass, or 0.2 to 2.0 parts by mass, with respect to 100 parts by mass of the total amount of the component (A) and the component (B).

In order to improve the handleability of the photosensitive resin composition or adjust the viscosity and the storage stability, the photosensitive resin composition can contain at least one kind of organic solvents. As the organic solvent, an organic solvent to be generally used can be used without particular limitation. Examples of the organic solvent include methanol, ethanol, acetone, methyl ethyl ketone, methyl cellosolve, ethyl cellosolve, toluene, N,N-dimethylformamide, propylene glycol monomethyl ether, and mixed solvents thereof. For example, the component (A), the component (B), and the component (C) are dissolved in an organic solvent and then the resultant solution can be used as a solution (hereinafter, referred to as "coating liquid") having a solid content of about 30 to 60% by mass. Note that, the solid content means a remaining component obtained by removing a volatile component from the solution of the photosensitive resin composition.

[Photosensitive Element]

A photosensitive element of the present embodiment includes: a support; and a photosensitive layer containing the above-described photosensitive resin composition formed on the support. In the case of using the photosensitive element of the present embodiment, the photosensitive layer may be laminated on a substrate and then may be exposed without the support being peeled off.

(Support)

As the support, a polymer film (support film) having heat resistance and solvent resistance, which is formed from a polyester such as polyethylene terephthalate (PET), or a polyolefin such as polypropylene or polyethylene, can be used. Particularly, from the viewpoint of ease of availability and excellent handleability (particularly, heat resistance, heat shrinkage rate, or rupture strength) in the production process, the support may be a PET film.

The haze of the support may be 0.01 to 1.0% or 0.01 to 0.5%. When the haze of the support is 0.01% or more, there is a tendency that the support itself is easily produced, and when the haze of the support is 1.0% or less, there is a tendency that microdefects, which may occur in a resist pattern, are reduced. Herein, the term "haze" means the degree of haze. The haze in the present disclosure refers to a value measured using a commercially available cloudiness meter (turbidimeter) according to the method defined in JIS K 7105. The haze can be measured, for example, using a commercially available turbidimeter such as NDH-5000 (manufactured by NIPPON DENSHOKU INDUSTRIES CO., LTD.).

Particles with a diameter of 5 μm or more, and the like included in the support may be present at $5/mm^2$ or less, and the support may be a support containing particles. Thereby, the slidability of the support surface is improved, and at the same time, a satisfactory balance to inhibit light scattering during exposure can be created and the resolution and the adhesiveness can be improved. The average particle diameter of particles may be 5 μm or less, 1 μm or less, or 0.1 μm or less. Note that, the lower limit value of the average particle diameter is not particularly limited, and may be 0.001 lam or more.

Examples of commercially available products as such a support include "QS48" (Toray Industries, Inc.), "FB40" (Toray Industries, Inc.), "QS69" (Toray Industries, Inc.), "R705G" (Mitsubishi Chemical Corporation), and "HTF-01" (Teijin Film Solutions Limited) which are a three-layer structure biaxially oriented PET film containing particles on an outermost layer, and "A-1517" (TOYOBO CO., LTD.) which is a two-layer structure biaxially oriented PET film having a layer containing particles on one surface.

The thickness of the support may be 1 to 100 μm, 5 to 50 μm, or 5 to 30 μm. When the thickness is 1 μm or more, the support can be suppressed from being torn when the support is peeled off, and when the thickness is 100 μm or less, a reduction in resolution can be suppressed.

(Intermediate Layer)

The photosensitive element may further include an intermediate layer (barrier layer) between the support and the photosensitive layer. The intermediate layer may be a layer containing a water-soluble resin. Examples of the water-soluble resin include a resin including polyvinyl alcohol as a main component.

(Protective Layer)

The photosensitive element may further include a protective layer as necessary. As the protective layer, a film in which the adhesive force between the photosensitive layer and the protective layer is smaller than the adhesive force between the photosensitive layer and the support may be used, and a film with low fisheye may be used. Specifically, as a protective film, for example, a polymer film that can be used as the support described above is mentioned. In view of the releasability from the photosensitive layer, the protective film may be a polyethylene film. The thickness of the protective layer varies depending on use application, but may be about 1 to 100 μm.

[Method for Producing Photosensitive Element]

The photosensitive element can be produced, for example, as follows. The photosensitive element can be produced by a production method including: preparing the above-described coating liquid; applying the coating liquid onto a support to form a coating layer; and drying the coating layer to form a photosensitive layer. The applying of the coating liquid on the support can be performed, for example, by known methods such as roll coating, comma coating, gravure coating, air knife coating, die coating, and bar coating.

The drying of the coating layer is not particularly limited as long as at least a part of an organic solvent can be removed from the coating layer. The drying may be performed, for example, at 70 to 150° C. for about 5 to 30 minutes. After the drying, the amount of the organic solvent remaining in the photosensitive layer may be 2% by mass or less from the viewpoint of preventing the diffusion of the organic solvent in the subsequent step.

The thickness of the photosensitive layer in the photosensitive element can be appropriately selected depending on use application, and the thickness after drying may be 1 to 100 μm, 1 to 50 μm, 1 to 40 μm, or 5 to 20 μm. When the thickness of the photosensitive layer is 1 μm or more, industrial coating is facilitated so that the productivity is improved, and when the thickness of the photosensitive layer is 100 μm or less, the adhesiveness and the resolution are further improved.

The photosensitive element can be suitably used, for example, in a method for forming a resist pattern described below. Particularly, from the viewpoint of the resolution, the photosensitive element is suitable for application to a method for producing a conductor pattern by a plating treatment.

[Method for Forming Resist Pattern]

A method for forming a resist pattern of the present embodiment includes: a photosensitive layer formation step of laminating a photosensitive layer containing the above-described photosensitive resin composition or a photosensitive layer of the above-described photosensitive element on a substrate; an exposure step of irradiating a predetermined part of the photosensitive layer with an active light ray to form a photo-cured area; and a development step of removing an area other than the predetermined part of the photosensitive layer from the substrate. The method for forming a resist pattern may include other steps as necessary. Note that, the resist pattern can be said to be a photo-cured product pattern or a relief pattern of the photosensitive resin composition. Furthermore, the method for forming a resist pattern can be said to be a method for producing a substrate with a resist pattern.

(Photosensitive Layer Formation Step)

As a method for forming the photosensitive layer on a substrate, for example, the photosensitive resin composition may be applied and dried, or the photosensitive layer may be pressure-bonded on the substrate while the photosensitive layer of the photosensitive element is heated after the protective layer is removed from the photosensitive element. In the case of using the photosensitive element, a laminate including the substrate, the photosensitive layer, and the support, which are laminated in this order, is obtained. The substrate is not particularly limited, and a substrate for circuit formation including an insulation layer and a conductor layer formed on the insulation layer, a metal base material for metal mask production, or a die pad (a base material for lead frame) such as an alloy base material is used.

The surface roughness (Ra) of the substrate may be 10 to 200 nm, to 100 nm, or 40 to 100 nm, from the viewpoint of further improving the resolution. When the Ra is 40 to 100 nm, halation due to irregularities on the substrate surface can be suppressed, so that the resolution is further improved.

In the case of using the photosensitive element, in view of the adhesiveness and the followability, the photosensitive layer formation step is preferably performed under reduced pressure. The heating of the photosensitive layer and/or the substrate during the pressure bonding may be performed at a temperature of 70 to 130° C. The pressure bonding may be performed at a pressure of about 0.1 to 1.0 MPa (about 1 to 10 kgf/$cm^2$), but these conditions are appropriately selected as necessary. Note that, when the photosensitive layer is heated to 70 to 130° C., there is no need to preheat the substrate in advance, but the substrate can also be preheated in order to further improve the adhesiveness and the followability.

(Exposure Step)

In the exposure step, at least a part of the photosensitive layer formed on the substrate is irradiated with an active light ray, thereby photo-curing an area irradiated with the active light ray to form a latent image. At this time, in a case where the support present on the photosensitive layer is transparent to the active light ray, the photosensitive layer can be irradiated with the active light ray through the support, whereas in a case where the support blocks the active light ray, the photosensitive layer is irradiated with the active light ray after the support is removed.

Examples of the exposure method include a method of performing imagewise irradiation with an active light ray via a negative or positive mask pattern called artwork (mask exposure method). Furthermore, a method of irradiating an image with an active light ray by a projection exposure method may be adopted.

Known light sources can be used as a light source for the active light ray, and for example, a carbon arc lamp, a mercury vapor arc lamp, a high-pressure mercury lamp, an ultrahigh pressure mercury lamp, a xenon lamp, a gas laser such as an argon laser, a solid-state laser such as a YAG laser, and a semiconductor laser, which efficiently emit ultraviolet rays or visible light, are used. The wavelength of the active light ray may be within a range of 340 nm to 430 nm.

(Development Step)

In the development step, at least a part of the photosensitive layer other than the photo-cured area is removed from the substrate, so that a resist pattern is formed on the substrate. In a case where the support is present on the photosensitive layer, after the support is removed, an area (also called an unexposed area) other than the photo-cured area is removed (developed). The development method includes wet development and dry development, and wet development is widely used.

In the case of the wet development, development is performed by a known development method using a developing solution corresponding to the photosensitive resin composition. Examples of the development method include methods using dipping, paddling, spraying, brushing, slapping, scrubbing, shaking immersion, and the like, and from the viewpoint of improving the resolution, a high-pressure spraying method may be used. Two or more kinds of these methods may be combined for the development.

The configuration of the developing solution is appropriately selected depending on the configuration of the photosensitive resin composition. For example, an alkaline aqueous solution and an organic solvent developing solution are mentioned.

In view of being safe and stable and having good handleability, an alkaline aqueous solution may be used as the developing solution. Examples of the base of the alkaline aqueous solution to be used include alkali hydroxides such as hydroxides of lithium, sodium, or potassium; alkaline carbonates such as carbonates or bicarbonates of lithium, sodium, potassium, or ammonium; alkali metal phosphates such as potassium phosphate and sodium phosphate; alkali metal pyrophosphates such as sodium pyrophosphate and potassium pyrophosphate; borax, sodium metasilicate, tetramethylammonium hydroxide, ethanolamine, ethylenediamine, diethylene triamine, 2-amino-2-hydroxymethyl-1,3-propanediol, 1,3-diaminopropanol-2, and morpholine.

As the alkaline aqueous solution to be used for development, a 0.1 to 5% by mass dilute solution of sodium carbonate, a 0.1 to 5% by mass dilute solution of potassium carbonate, a 0.1 to 5% by mass dilute solution of sodium hydroxide, a 0.1 to 5% by mass dilute solution of sodium tetraborate, or the like can be used. The pH of the alkaline aqueous solution to be used for development may be set in a range of 9 to 11, and the temperature thereof can be adjusted according to the alkali developability of the photosensitive layer.

Into the alkaline aqueous solution, for example, a surfactant, an antifoaming agent, a small amount of an organic solvent for promoting development, or the like may be incorporated. Note that, examples of the organic solvent used for the alkaline aqueous solution include acetone, ethyl acetate, alkoxyethanol having an alkoxy group having 1 to 4 carbon atoms, ethyl alcohol, isopropyl alcohol, butyl alcohol, diethylene glycol monomethyl ether, diethylene glycol monoethyl ether, and diethylene glycol monobutyl ether.

Examples of the organic solvent used for the organic solvent developing solution include 1,1,1-trichloroethane, N-methylpyrrolidone, N,N-dimethylformamide, cyclohexanone, methyl isobutyl ketone, and γ-butyrolactone. It may be possible that water is added to these organic solvents within a range of 1 to 20% by mass for anti-flammability to prepare the organic solvent developing solution.

The method for forming a resist pattern in the present embodiment may include a step of further curing the resist pattern by heating at about 60 to 250° C. or exposing at about 0.2 to 10 J/$cm^2$, as necessary, after the uncured area is removed in the development step.

[Method for Producing Printed Wiring Board]

A method for producing a printed wiring board of the present embodiment includes a step of subjecting a substrate having a resist pattern formed by the above-described method for forming a resist pattern to an etching treatment or a plating treatment to form a conductor pattern. The method for producing a printed wiring board may include other steps such as a resist pattern removing step, as necessary.

In the plating treatment, the resist pattern formed on the substrate is used as a mask, and a conductor layer provided on the substrate is subjected to the plating treatment. After the plating treatment, a conductor pattern may be formed by removing the resist by the removal of the resist pattern described below and further etching the conductor layer covered by the resist.

The plating treatment method may be either an electrolytic plating treatment or an electroless plating treatment, but may be an electroless plating treatment. In the etching treatment, the resist pattern formed on the substrate is used as a mask, and the conductor layer formed on the substrate is removed by etching to form a conductor pattern. The etching treatment method is appropriately selected depending on the conductor layer to be removed. Examples of an etching solution include a cupric chloride solution, a ferric chloride solution, an alkali etching solution, and a hydrogen peroxide-based etching solution.

After the etching treatment or the plating treatment, the resist pattern on the substrate may be removed. The resist pattern can be removed by being peeled off, for example, with an aqueous solution of stronger alkalinity than the alkaline aqueous solution used in the development step. As this strong alkaline aqueous solution, for example, a 1 to 10% by mass sodium hydroxide aqueous solution, a 1 to 10% by mass potassium hydroxide aqueous solution, and the like are used.

In a case where the resist pattern is removed after the plating treatment, a desired printed wiring board can be produced by further subjecting the conductor layer covered by the resist to the etching treatment to form a conductor pattern. The etching treatment method at this time is appropriately selected depending on the conductor layer to be removed. For example, the above-described etching solution can be applied.

The method for producing a printed wiring board according to the present embodiment can be applied not only to production of single-layer printed wiring boards but also to production of multilayer printed wiring boards, and can also be applied to production of printed wiring boards having small diameter through-holes, and the like.

EXAMPLES

Hereinafter, the present disclosure will be more specifically described by means of Examples; however, the present disclosure is not limited to these Examples. Note that, unless otherwise specified, the units "part(s)" and "%" are mass basis.

(Binder Polymer (A-1))

95 g of methacrylic acid, 232 g of styrene, 26 g of dicyclopentanyl methacrylate, and 4 g of azobisisobutyronitrile, which are polymerizable monomers (monomers), were mixed to prepare a solution a. Furthermore, 0.4 g of azobisisobutyronitrile was mixed with a mixed liquid of 11 g of 1-methoxy-2-propanol and 6 g of toluene (mass ratio of 3:2) to prepare a solution b.

Into a flask equipped with a stirrer, a reflux condenser, a thermometer, a dropping funnel, and a nitrogen gas inlet tube, 17 g of a mixed liquid of 11 g of 1-methoxy-2-propanol and 6 g of toluene (mass ratio of 3:2) was charged. Next, heating was performed while stirring and blowing nitrogen gas into the flask, raising the temperature to 80° C.

The solution a was added dropwise to the mixed liquid in the flask over 4 hours, and then stirred at 80° C. for 2 hours. Next, the solution b was added dropwise to the solution in the flask over 10 minutes, and then stirred at 80° C. for 2 hours. Further, while continuing stirring, the solution in the flask was heated to 110° C. over 30 minutes. Next, the solution b was newly added dropwise thereto over 10 minutes, and then stirred at 110° C. for 5 hours. Next, stirring was stopped, and the resultant solution was cooled to room temperature to obtain a solution of a binder polymer (A-1). Note that, in the present specification, the room temperature means 25° C.

The Mw of the binder polymer (A-1) was 20500. The Mw was measured by gel permeation chromatography (GPC) and was derived by conversion using a calibration curve of standard polystyrene. The calibration curve was approximated by the cubic formula of the universal calibration curve using five sets of standard polystyrene samples (PStQuick MP-H, PStQuick B [manufactured by Tosoh Corporation, trade name]) according to JIS K 7252-2 (2016). GPC conditions are shown below.

(GPC Conditions)

Column: Gelpack GL-R440, Gelpack GL-R450, and Gelpack GL-R400M (all manufactured by Showa Denko Materials Co., Ltd.) are connected Eluent: Tetrahydrofuran (THF)

Measurement temperature: 40° C.

Flow rate: 2.05 mL/min

Detector: Hitachi L-2490 type RI (manufactured by Hitachi, Ltd.)

Note that, in a case where the binder polymer included in the photosensitive layer of the resin film is to be measured, 10 mg of the photosensitive layer is put in a microtube, the photosensitive layer is dissolved by adding 2 mL of THF to prepare a solution, and GPC is measured using 200 μL of the solution as a sample.

(Binder Polymers (A-2) to (A-6))

Solutions of binder polymers (A-2) to (A-6) were obtained in the same manner as in preparation of the solution of the binder polymer (A-1), except that the amount of azobisisobutyronitrile was changed and the reaction temperature or time was changed.

(Binder Polymer (A-7))

A solution of a binder polymer (A-7) was obtained in the same manner as in preparation of the solution of the binder polymer (A-1), except that methacrylic acid, methyl methacrylate, styrene, and benzyl methacrylate were used as polymerizable monomers at mass ratios shown in Table 1, the reaction temperature was changed to 95° C., and the reaction time was changed to 3 hours.

As for the binder polymers (A-1) to (A-7), the mass ratio (%) of the polymerizable monomers and the Mw are shown in Table 1.

TABLE 1

| | Binder polymer | | | | | | |
|---|---|---|---|---|---|---|---|
| | A-1 | A-2 | A-3 | A-4 | A-5 | A-6 | A-7 |
| Methacrylic acid | 27 | 27 | 27 | 27 | 27 | 27 | 27 |
| Methyl methacrylate | — | — | — | — | — | — | 5 |
| Styrene | 65.7 | 65.7 | 65.7 | 65.7 | 65.7 | 65.7 | 45 |
| Benzyl methacrylate | — | — | — | — | — | — | 23 |
| Dicyclopentanyl methacrylate | 7.3 | 7.3 | 7.3 | 7.3 | 7.3 | 7.3 | — |
| Mw | 20500 | 18100 | 15200 | 12000 | 9500 | 7600 | 40000 |

Examples 1 to 3 and Comparative Example 1

<Preparation of Photosensitive Resin Composition>

Photosensitive resin compositions of Examples and Comparative Example were prepared, respectively, by mixing the binder polymers (A-1) to (A-7) with the (B) photopolymerizable compound, the (C) photopolymerization initiator, the (D) sensitizer, other components, and a solvent at blending amounts (parts by mass) shown in Table 2 or Table 3 below. Note that, the blending amount of the binder polymer shown in Tables 2 and 3 is the mass (solid content) of the nonvolatile components.

((B) Photopolymerizable Compound)

- B-1: 2,2-Bis(4-(methacryloxypentaethoxy)phenyl)propane (manufactured by Showa Denko Materials Co., Ltd., trade name: FA-321M)
- B-2: Ethoxylated bisphenol A dimethacrylate (EO average 4 mol-modified) (manufactured by SHIN-NAKAMURA CHEMICAL Co., Ltd., trade name: BPE-200)
- B-3: (PO)(EO)(PO)-modified polyethylene glycol dimethacrylate (EO average 6-mol and PO average 12-mol modified) (manufactured by Showa Denko Materials Co., Ltd., trade name: FA-024M)

((C) Photopolymerization Initiator)

- C-1: 2,2'-Bis(2-chlorophenyl)-4,4',5,5'-tetraphenyl-1,2-biimidazole (manufactured by Hodogaya Chemical Co., Ltd., trade name: B-CIM)

((D) Sensitizer)

- D-1: 1-Phenyl-3-(4-methoxystyryl)-5-(4-methoxyphenyl) pyrazoline (manufactured by NIPPON CHEMICAL INDUSTRIAL CO., LTD.)

((F) Other Components)

- F-1: Leuco crystal violet (manufactured by Yamada Chemical Co., Ltd.)
- F-2: Malachite green (manufactured by OSAKA ORGANIC CHEMICAL INDUSTRY LTD.)
- F-3: tert-Butylcatechol (manufactured by FUJIFILM Wako Pure Chemical Corporation)
- F-4: Benzotriazole derivative (manufactured by SANWA KASEI CORP., trade name: SF-808H)
- F-5: 3-Mercaptopropyltrimethoxysilane (manufactured by Shin-Etsu Chemical Co., Ltd.)
- F-6: 2,2',4,4'-Tetrahydroxybenzophenone (manufactured by SHIPRO KASEI KAISHA, LTD.)

<Production of Photosensitive Element>

Examples 1 to 12 and Comparative Example 1

The solution of the photosensitive resin composition was uniformly applied onto a PET film (manufactured by Toray Industries, Inc., trade name "QS69") having a thickness of 16 μm, dried for 10 minutes by a hot air convection drier set at 90° C., and then protected by a polyethylene film (manufactured by TAMAPOLY CO., LTD., trade name "NF-15A"), thereby obtaining a laminate (photosensitive element) in which the support, the photosensitive layer, and the protective film are laminated. The thickness of the photosensitive layer after drying was 6 μm.

Examples 9 and 10

Photosensitive elements were obtained in the same manner as described above, except that the PET film (QS69) was changed to a film having a barrier layer formed on the PET film. The barrier layer was formed by the following procedure.

60 parts by mass of polyvinyl alcohol (manufactured by Kuraray Co., Ltd., trade name: PVA-205, degree of saponification=87 mol %) and parts by mass of polyvinylpyrrolidone (manufactured by NIPPON SHOKUBAI CO., LTD., trade name: K-30) were slowly added to 500 parts by mass of water and 250 parts by mass of 1-propanol at room temperature and mixed. The mixed liquid was heated to 90° C., stirred for 1 hour, and cooled to room temperature, thereby obtaining a resin composition for barrier layer formation. Next, the resin composition for barrier layer formation was applied onto the PET film (QS69) to have an uniform thickness, and dried for 10 minutes by a hot air convection drier set at 95° C., thereby forming a barrier layer having a thickness after drying of 5 μm.

<Production of Laminate>

A substrate (Ra: 40 nm) having a copper layer was rinsed, pickled, rinsed, and then dried with an air stream. Thereafter, the substrate was heated to 80° C., and the photosensitive element was laminated on the copper surface of the substrate. The lamination was performed using a heat roll set at 110° C. with a bonding pressure of 0.4 MPa and a roll speed of 1.0 m/min such that the photosensitive layer of the photosensitive element was in contact with the copper surface of the substrate, while the protective layer was peeled off. In this way, a laminate in which the substrate, the photosensitive layer, and the support are laminated in this order was obtained. The obtained laminate was used as a test specimen for a test described below.

(Evaluation of Resolution and Adhesiveness)

On the support of the test specimen, a glass chromium-type phototool (negative for resolution: one having a wiring pattern with a line width/space width of x/x (x: 1 to 18, unit: μm), negative for adhesiveness: one having a wiring pattern with a line width/space width of x/x (x: 1 to 18, unit: μm)) was used as a negative for evaluation of resolution and adhesiveness, and the photosensitive layer was exposed at a predetermined energy dose by using a projection exposure apparatus (manufactured by Ushio Inc., trade name "UX-44101SM") equipped with an ultrahigh pressure mercury lamp (365 nm) as a light source. After exposure, the support was peeled off to expose the photosensitive layer, and a 1% by mass sodium carbonate aqueous solution set at 27° C. was sprayed for a time three times the minimum developing time (the minimum time for removing the unexposed area) to remove the unexposed area (development treatment).

After the development treatment, the resolution and the adhesiveness were evaluated by the minimum value of the line width/space width among values of the line width/space width for resist patterns formed with cleanly removed space areas (unexposed areas), and without twists, meandering, and chipping of the line areas (exposed areas). A smaller numerical value indicates more satisfactory resolution and adhesiveness.

TABLE 2

| | | Example | | | | | | | |
|---|---|---|---|---|---|---|---|---|---|
| | | 1 | 2 | 3 | 4 | 5 | 6 | 7 | 8 |
| (A) | A-1 (Mw: 20500) | 57.0 | 57.0 | — | — | — | — | — | — |
| | A-2 (Mw: 18100) | — | — | 57.0 | 57.0 | — | — | — | — |
| | A-3 (Mw: 15200) | — | — | — | — | 57.0 | 57.0 | — | — |
| | A-4 (Mw: 12000) | — | — | — | — | — | — | 57.0 | 57.0 |
| (B) | B-1 | 30.5 | 30.5 | 30.5 | 30.5 | 30.5 | 30.5 | 30.5 | 30.5 |
| | B-2 | 10.0 | 10.0 | 10.0 | 10.0 | 10.0 | 10.0 | 10.0 | 10.0 |
| | B-3 | 2.5 | 2.5 | 2.5 | 2.5 | 2.5 | 2.5 | 2.5 | 2.5 |
| (C) | C-1 | 2.9 | 2.9 | 2.9 | 2.9 | 2.9 | 2.9 | 2.9 | 2.9 |
| (D) | D-1 | 0.02 | 0.02 | 0.02 | 0.02 | 0.02 | 0.02 | 0.02 | 0.02 |
| (F) | F-1 | 0.5 | 0.5 | 0.5 | 0.5 | 0.5 | 0.5 | 0.5 | 0.5 |
| | F-2 | 0.05 | 0.05 | 0.05 | 0.05 | 0.05 | 0.05 | 0.05 | 0.05 |
| | F-3 | 0.05 | 0.05 | 0.05 | 0.05 | 0.05 | 0.05 | 0.05 | 0.05 |
| | F-4 | 1.0 | 1.0 | 1.0 | 1.0 | 1.0 | 1.0 | 1.0 | 1.0 |
| | F-5 | 0.5 | 0.5 | 0.5 | 0.5 | 0.5 | 0.5 | 0.5 | 0.5 |
| | F-6 | — | 0.25 | — | 0.25 | — | 0.25 | — | 0.25 |
| Barrier layer | | Absent | Absent | Absent | Absent | Absent | Absent | Absent | Absent |
| Exposure dose ($mJ/cm^2$) | | 320 | 380 | 320 | 380 | 320 | 380 | 320 | 380 |
| Resolution (μm) | | 2.6 | 2.2 | 2.6 | 2.2 | 2.6 | 2.2 | 2.6 | 2.2 |
| Adhesiveness (μm) | | 1.9 | 1.9 | 1.9 | 1.9 | 1.9 | 1.9 | 1.9 | 1.9 |

TABLE 3

| | | Example | | | | | | Comparative Example |
|---|---|---|---|---|---|---|---|---|
| | | 9 | 10 | 11 | 12 | 13 | 14 | 1 |
| (A) | A-4 (Mw: 12000) | 57.0 | 57.0 | — | — | — | — | — |
| | A-5 (Mw: 9500) | — | — | 57.0 | 57.0 | — | — | — |
| | A-6 (Mw: 7600) | — | — | — | — | 57.0 | 57.0 | — |
| | A-7 (Mw: 40000) | — | — | — | — | — | — | 57.0 |
| (B) | B-1 | 30.5 | 30.5 | 30.5 | 30.5 | 30.5 | 30.5 | 30.5 |
| | B-2 | 10.0 | 10.0 | 10.0 | 10.0 | 10.0 | 10.0 | 10.0 |
| | B-3 | 2.5 | 2.5 | 2.5 | 2.5 | 2.5 | 2.5 | 2.5 |
| (C) | C-1 | 2.9 | 2.9 | 2.9 | 2.9 | 2.9 | 2.9 | 2.9 |
| (D) | D-1 | 0.02 | 0.02 | 0.02 | 0.02 | 0.02 | 0.02 | 0.02 |
| (F) | F-1 | 0.5 | 0.5 | 0.5 | 0.5 | 0.5 | 0.5 | 0.5 |
| | F-2 | 0.05 | 0.05 | 0.05 | 0.05 | 0.05 | 0.05 | 0.05 |
| | F-3 | 0.05 | 0.05 | 0.05 | 0.05 | 0.05 | 0.05 | 0.05 |
| | F-4 | 1.0 | 1.0 | 1.0 | 1.0 | 1.0 | 1.0 | 1.0 |
| | F-5 | 0.5 | 0.5 | 0.5 | 0.5 | 0.5 | 0.5 | 0.5 |
| | F-6 | — | 0.25 | — | 0.25 | — | 0.25 | — |

TABLE 3-continued

| | Example | | | | | | Comparative Example |
|---|---|---|---|---|---|---|---|
| | 9 | 10 | 11 | 12 | 13 | 14 | 1 |
| Barrier layer | Present | Present | Absent | Absent | Absent | Absent | Absent |
| Exposure dose (mJ/cm$^2$) | 300 | 360 | 320 | 380 | 320 | 380 | 280 |
| Resolution (μm) | 2.6 | 2.2 | 2.6 | 2.2 | 2.6 | 2.2 | 2.7 |
| Adhesiveness (μm) | 1.9 | 1.9 | 2.1 | 2.1 | 2.3 | 2.3 | 2.7 |

From Tables 2 and 3, it can be confirmed that the photosensitive resin compositions of Examples 1 to 14 are excellent in resolution and adhesiveness as compared to Comparative Example 1 and can form fine resist patterns.

The invention claimed is:

1. A photosensitive resin composition comprising a binder polymer, a photopolymerizable compound, and a photopolymerization initiator, wherein the binder polymer includes a structural unit derived from a (meth)acrylate compound having a dicyclopentanyl group and a structural unit derived from styrene or a styrene derivative, and a weight average molecular weight of the binder polymer is 9000 to 21000, wherein a content of the structural unit derived from a (meth)acrylate compound having a dicyclopentanyl group is 1 to 10% by mass on the basis of the total mass of structural units derived from polymerizable monomers constituting the binder polymer, and wherein a content of the structural unit derived from a (meth)acrylate compound having a dicyclopentanyl group and the structural unit derived from styrene or a styrene derivative is 50% by mass or more on the basis of the total mass of structural units derived from polymerizable monomers constituting the binder polymer.

2. The photosensitive resin composition according to claim 1, further comprising a sensitizer having an absorption at 340 to 430 nm.

3. The photosensitive resin composition according to claim 1, wherein the photopolymerizable compound includes a bisphenol A-type (meth)acrylate.

4. The photosensitive resin composition according to claim 3, wherein the bisphenol A-type (meth)acrylate includes 2,2-bis(4-((meth)acryloxypolyethoxy)phenyl)propane.

5. The photosensitive resin composition according to claim 3, wherein the bisphenol A-type (meth)acrylate includes 2,2-bis(4-((meth)acryloxydipropoxy)phenyl)propane.

6. The photosensitive resin composition according to claim 3, wherein the bisphenol A-type (meth)acrylate includes 2,2-bis(4-(methacryloxypentaethoxy)phenyl)propane.

7. The photosensitive resin composition according to claim 1, wherein the photopolymerizable compound includes polyalkylene glycol di(meth)acrylate.

8. A photosensitive element comprising a support, and a photosensitive layer containing the photosensitive resin composition according to claim 1 formed on the support.

9. A method for forming a resist pattern, the method comprising:

a photosensitive layer formation step of laminating a photosensitive layer containing the photosensitive resin composition according to claim 1 on a substrate;

an exposure step of irradiating a predetermined part of the photosensitive layer with an active light ray to form a photo-cured area; and a development step of removing an area other than the predetermined part of the photosensitive layer from the substrate.

10. The method for forming a resist pattern according to claim 9, wherein a wavelength of the active light ray is within a range of 340 nm to 430 nm.

11. A method for producing a printed wiring board, the method comprising a step of subjecting a substrate having a resist pattern formed by the method for forming a resist pattern according to claim 9 to an etching treatment or a plating treatment to form a conductor pattern.

12. A method for forming a resist pattern, the method comprising:

a photosensitive layer formation step of laminating a photosensitive layer of the photosensitive element according to claim 8 on a substrate;

an exposure step of irradiating a predetermined part of the photosensitive layer with an active light ray to form a photo-cured area; and a development step of removing an area other than the predetermined part of the photosensitive layer from the substrate.

13. The method for forming a resist pattern according to claim 12, wherein a wavelength of the active light ray is within a range of 340 nm to 430 nm.

14. A method for producing a printed wiring board, the method comprising a step of subjecting a substrate having a resist pattern formed by the method for forming a resist pattern according to claim 12 to an etching treatment or a plating treatment to form a conductor pattern.

* * * * *